United States Patent [19]
D'Arrigo et al.

[11] Patent Number: 5,265,052
[45] Date of Patent: Nov. 23, 1993

[54] WORDLINE DRIVER CIRCUIT FOR EEPROM MEMORY CELL

[75] Inventors: Sebastiano D'Arrigo, Houston, Tex.; Giuliano Imondi, Rieti, Italy; Sung-Wei Lin, Houston; Manzur Gill, Rosharon, both of Tex.

[73] Assignee: Texas Instruments Incorporated, Dallas, Tex.

[21] Appl. No.: 909,526

[22] Filed: Jun. 29, 1992

Related U.S. Application Data

[63] Continuation of Ser. No. 692,802, Apr. 24, 1991, abandoned, which is a continuation of Ser. No. 382,356, Jul. 20, 1989, abandoned.

[51] Int. Cl.[5] .............................................. G11C 7/00
[52] U.S. Cl. ........................... 365/189.09; 365/185; 365/189.11; 365/218; 365/230.06; 365/226
[58] Field of Search .................. 365/230.06, 185, 104, 365/218, 226, 189.09, 203, 204, 189.11

[56] References Cited

U.S. PATENT DOCUMENTS

| | | | |
|---|---|---|---|
| 4,499,388 | 2/1985 | Adam | 307/473 |
| 4,565,932 | 1/1986 | Kuo et al. | 365/185 |
| 4,694,430 | 9/1987 | Rosier | 365/189 |
| 4,720,816 | 1/1988 | Matsuoka et al. | 365/230.06 |
| 4,733,375 | 3/1988 | Terashima | 365/104 |
| 4,737,936 | 4/1988 | Takeuchi | 365/189.09 |
| 4,742,492 | 5/1988 | Smayling et al. | 365/185 |
| 4,761,764 | 8/1988 | Watnabe | 365/185 |
| 4,823,318 | 4/1989 | D'Arrigo et al. | 365/218 |
| 4,893,275 | 1/1990 | Tanaka et al. | 365/230.06 |
| 5,136,541 | 8/1992 | Arakawa | 365/189.09 |

Primary Examiner—Joseph E. Clawson, Jr.
Attorney, Agent, or Firm—Theodore D. Lindgren; Leo N. Heiting; Richard L. Donaldson

[57] ABSTRACT

A circuit for applying reading, programming and erasing voltages to a wordline in a floating-gate-type EEPROM cell array comprising a positive voltage switching circuit, a first isolating transistor, and a second isolating transistor. The positive voltage switching circuit may include an inverter with feedback transistor and a third isolating transistor. In one embodiment, the positive voltage switching circuit is capable of switching up to three positive voltage values and reference voltage to the wordline terminal.

19 Claims, 1 Drawing Sheet

WORDLINE DRIVER CIRCUIT FOR EEPROM MEMORY CELL

This application is a continuation of application Ser. No. 692,802, filed Apr. 24, 1991, now abandoned, which is a continuation of application Ser. No. 382,356, filed Jul. 20, 1989, now abandoned.

BACKGROUND OF THE INVENTION

This invention relates to circuitry for applying reading, programming and erasing voltages to wordlines of floating-gate-type, electrically-erasable-programmable-memory (EEPROM) arrays and to the control gates of the individual memory cells attached to those wordlines.

This application discloses and claims circuitry that is an improvement over the wordline driver circuitry described in U.S. Pat. No. 4,823,318, issued Apr. 18, 1989 and also assigned to Texas Instruments Incorporated.

EEPROM arrays of the type used with the circuitry of this application are described, for example, in copending U.S. Pat. applications No. 07/274,718 (a continuation of U.S. Pat. application No. 07/056,196, now abandoned); No 07219,528; No. 07/219,529 and No. 07/219,530; each of those applications being also assigned to Texas Instruments Incorporated. EEPROM arrays of the type described in the foregoing applications require circuitry that will switch as many as four different values of voltage to each wordline for the purposes of reading, programming and erasing information stored on the floating gates. One of those voltages, the erasing voltage, must be negative with respect to the bitlines or source-drain regions.

During read operation of EEPROM cells of the floating-gate type, a voltage Vsv of perhaps +3 volts above reference potential is applied to the wordline and control gate of the selected cell, with the source connected to reference potential Vss, which may be the circuit ground, and with the drain connected to a read voltage of perhaps +1.5 volts above reference potential. Non-selected wordlines are usually tied to reference potential Vss.

During programming operation of such EEPROM cells, a voltage Vpp of perhaps +12 to +16 volts above reference potential is applied to the wordline and control gate of the selected cell, with the source of the selected cell at reference potential Vss and with the drain of the selected cell either allowed to float or tied to a low voltage or reference potential Vss. The programming voltage Vpp is typically applied for a period of 10 milliseconds and produces a shift in voltage threshold of approximately 4.5 volts or more. Non-selected wordlines may be connected to reference potential Vss or, to prevent disturb on non-selected cells, the non-selected wordlines may be connected to a voltage of perhaps +6 to +8 volts above reference potential Vss.

During erasing operation of such EEPROM cells, a voltage Ver of perhaps −10 to −12 volts below reference potential Vss is applied to the wordline and control gate of the selected cell or, in the cases of a so-called "flash-erase" type of EEPROMs, to all of the wordlines and control gates with the sources of the erased cells being at perhaps +4 to +6 volts above reference potential Vss and with the drains allowed to float or tied to a low voltage or reference potential Vss. The erasing voltages are typically applied for a period of 10 milliseconds and produce a voltage threshold of approximately one volt. The non-selected wordlines are usually tied to reference potential Vss during erasure.

The various EEPROM wordline voltages may be generated from the approximately +5 volt external supply voltage Vdd using charge-pump capacitors located on the memory chip. Circuits for switching from one voltage to a second voltage are well-known. For example, such circuits are used to change the bitline voltages from one value to another value when changing from the programming mode of operation to the erasing mode of operation. Such circuits for switching between a positive read voltage, a positive programming voltage, and a reference voltage are known in the prior art pertaining to electrically-programmable-read-only-memories (EPROMs). However, in the case of EEPROMs, there is a need for improved circuits that will not only switch wordline reading and programming voltages, but which will also switch negative erasing voltages to the selected wordline. Switching of negative voltages presents a unique problem in that such circuits must be designed to prevent P-N junctions between the diffused areas and the substrate of such integrated circuits from becoming forward biased during application of negative erase voltages.

In addition, there is a need for circuitry that will supply a third value of positive voltage to non-selected wordlines during programming operation and to thereby lessen the probability that non-selected memory cells will be disturbed.

SUMMARY OF THE INVENTION

The circuit of this invention includes a circuit means for switching positive voltages to a wordline, a first isolating transistor connected between the output of the positive-voltage-switching means and the wordline, and a second isolating transistor connected between an erasing voltage source and the wordline. The isolating transistors may be P-channel transistors with substrates or tanks connected, for example, to the programming voltage source during programming and to the read voltage source during reading and erasing.

In one embodiment, the positive-voltage-switching means provides three values of positive voltage as well as the reference voltage to the wordline. The three values of positive voltage are used for programming, for reading, and for disturb protection and all three values may be different from the supply voltage value. The positive-voltage-switching means includes a two-transistor inverter with a separate feedback transistor and includes a third isolating transistor.

BRIEF DESCRIPTION OF THE DRAWINGS

The novel features of this invention are set forth in the appended claims. The invention, its features, and its advantages are described below in conjunction with the following drawing:

DETAILED DESCRIPTION OF THE SPECIFIC EMBODIMENT

Figure 1:
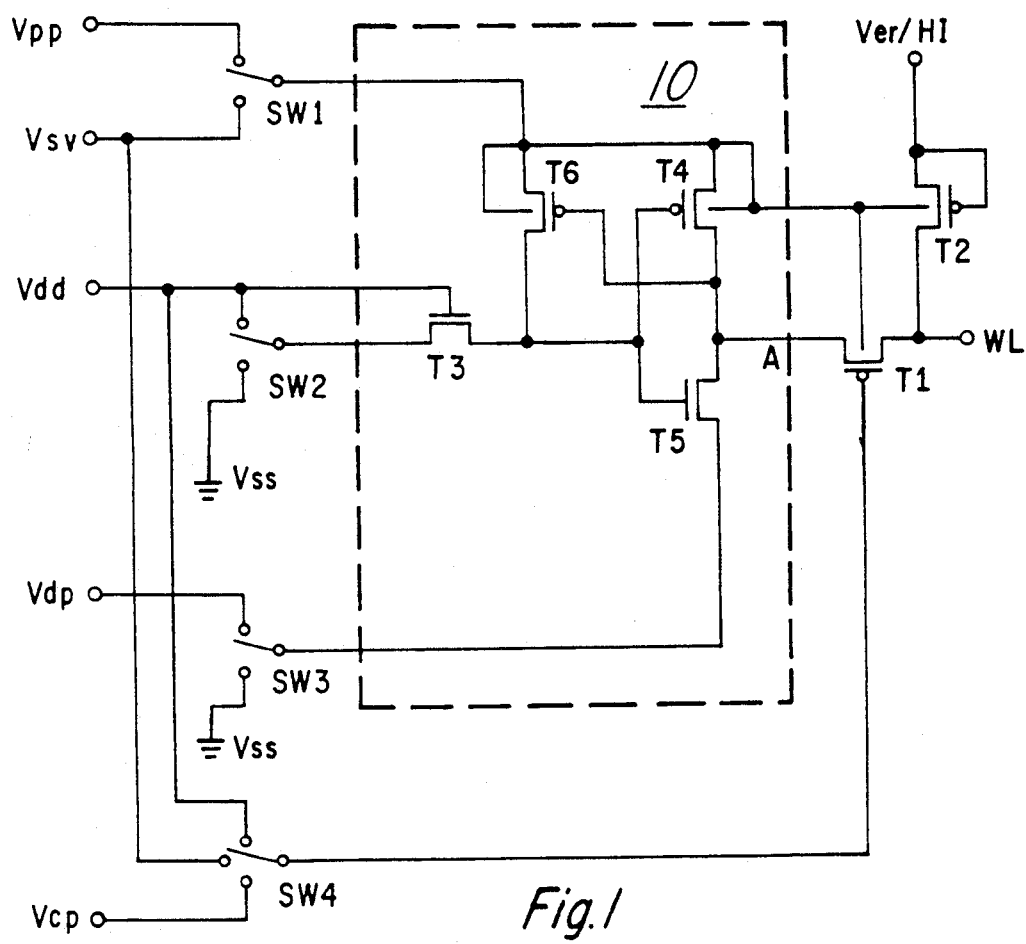
FIG. 1 is a circuit diagram of the improved circuit of this invention.

Referring to FIG. 1, positive-voltage-switching circuit 10 is illustrated as having four input voltages. Voltage input Vdd may be a voltage generated externally from the chip and may be in the range of +4 to +6 volts above reference voltage Vss, which may be ground potential. Voltage input Vpp is a programming voltage input that may be, for example, in the range of +12 to +16 volts above reference potential Vss. Sense voltage input Vsv is a read voltage input that may be, for example, approximately +3 volts above reference potential Vss. Optional disturb-protect voltage input Vdp may be, for example, in the range of +6 to +8 volts above reference potential Vss. Voltage inputs Vpp, Vsv, and Vdp may be derived on the chip from external voltage source Vdd through use of capacitive charge-pump circuits, which are known in the prior art.

Input voltages Vpp and Vsv with switch SW1 comprise a programing/sense voltage source. Input voltages Vdd with Vss and switch SW2 comprise a supply/reference voltage source. Input voltage Vdp with Vss and SW3 comprise a disturb-protect/reference voltage source.

Positive-voltage-switching circuit 10 supplies the positive programming and reading voltages Vpp and Vsv as well as reference potential Vss to terminal WL, and may supply a positive disturb-protect voltage Vdp to terminal WL, which is connected to a wordline of a floating-gate memory array.

Terminal Ver/HI is connected to a pulsed negative erase voltage source. The pulses may, for example, be in the range of −12 to −14 volts below reference potential Vss and may be perhaps 10 milliseconds in length. The source Ver/HI is characterized by having a high impedance during times when the pulse voltage is not active. The negative erasing voltage supply Ver may also be generated on the chip from the external power supply Vdd through use of a capacitor-type charge pump.

First isolating transistor T1 is connected with source-drain path between the output terminal A of positive-voltage-switching circuit 10 and the wordline terminal WL. The gate of P-channel first isolating transistor T1 is connected by electronic switch SW4 to a negative signalling voltage source Vcp during reading operations, to read voltage source Vsv during programming operations in which positive voltage pulses are applied to a selected wordline WL, and to supply voltage source Vdd during erasing operations in which negative voltage pulses are applied to all wordlines WL or to selected wordlines WL. Signalling voltage source Vcp is typically −3 volts to −5 volts below reference voltage. The substrate or tank of first isolating transistor T1 is connected, for example, by electronic switch SW1 to sense voltage Vsv during reading or erasing and to programming voltage source Vpp during programming operation. As is well-known, the tank or substrate voltage must be equal to or higher than the voltage on wordline WL to prevent forward biasing of the junctions between source or drain and the tank or substrate. Input voltages Vcp, Vsv and Vdd, together with switch SW4, comprise a supply/sense/signalling voltage source.

Second isolating transistor T2 is connected with source-drain path between erasing voltage source Ver/HI and wordline terminal WL. The gate of P-channel second isolating transistor T2 is connected to the drain of transistor T2, which is connected to supply source Ver/HI. The tank or substrate of second isolating transistor T2 is also connected, for example, by electronic switch SW1 to sense voltage Vsv during reading and erasing operations and to programming voltage source Vpp during programming operation to prevent forward-biasing of junctions.

Positive-voltage-switching circuit 10 may include an inverter with P-channel transistor T4 and N-channel transistor T5 having source-drain paths connected in series between electronic switches SW1 and SW3 and with gates connected to a source-drain terminal of optional third isolating N-channel transistor T3. The commonly connected source-drain terminals of transistors T4 and T5 are connected to output terminal A of positive-voltage-switching circuit 10. The inverter may include a P-channel feedback transistor T6 with source-drain path connected between switch SW1 and the same source-drain terminal of third isolating transistor T3 and with gate connected to the output terminal A of positive-voltage-switching circuit 10. The tanks or substrates of P-channel transistors T4 and T6 are connected to switch SW1. The other source-drain terminal of optional third isolating transistor T3 is connected by electronic switch SW2 to supply voltage Vdd or to reference voltage Vss, depending upon whether the wordline WL is selected or deselected. Optional third isolating transistor T3 protects circuitry attached to switch SW2 from possible harm caused by programming pulses from source Vpp. The T5 terminal of the inverter is connected by optional switch SW3 to disturb-protect voltage supply Vdp during programming operation and to reference voltage Vss during reading and erasing operations.

During programming, or writing, mode of operation of a particular driver circuit that is connected to a selected wordline, the voltage applied by switch SW2 to the inverter is low and, therefore, transistor T5 is nonconductive and transistor T4 is conductive. Transistor T2 is nonconductive because of the characteristic high impedance of erasing voltage source Ver/HI. Because switch SW1 is in the Vpp position and switch SW4 is in the Vsv position, the voltage at the terminal WL will be equal to Vpp. For a particular driver circuit that is connected to a non-selected wordline, the voltage applied by switch SW4 is Vsv (+3 volts for example) and the voltage applied by switch SW2 is Vdd (+5 volts, for example). Transistor T4 will be nonconductive, transistors T1 and T5 will be conductive and the voltage at the terminal WL will be disturb-protect voltage Vdp.

During erasing mode of operation of a particular driver circuit, the voltage Vcp applied by switch SW4 is high (+5 volts, for example) and therefore transistor T1 is nonconductive. Transistor T2 is connected in diode configuration and conducts during the negative erasing pulse applied by source Ver/HI. For non-flash EEPROM applications, the driver circuits connected to non-selected wordlines may be activated such that transistors T1 and T5 connect those wordlines to reference potential.

During reading mode of operation of a driver circuit attached to a selected wordline, the voltage applied by switch SW2 to the inverter is low (0 volts, for example) and, therefore, transistors T4 and T5 are as described for programming operation. Because the voltage applied by switch SW1 is equal to Vsv rather than Vpp, the voltage at the terminal WL will be equal to Vsv. For a driver circuit attached to a non-selected wordline, the voltage applied by switch SW2 to the inverter is high, causing transistor T5 to conduct and, with switch S3 connected to reference potential, connects terminal WL to that reference potential.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A circuit for applying voltages to a wordline in a floating-gate memory cell array, comprising;
   a first voltage supply circuit for supplying at least a first voltage to a first node;
   a second voltage supply circuit for supplying at least a second voltage to a second node;
   a third voltage supply circuit for selectively supplying a third voltage to the wordline;
   a switching circuit for selectively coupling one of said first voltage supply circuit and said second voltage supply circuit to an output node, the switching circuit including an inverter having a first transistor and a second transistor with current paths connected in series between said first node and said second node, the output node connected between the current paths of said first transistor and said second transistor; and
   a first isolating transistor having a current path coupled between said output node and the wordline for isolating the switching circuit from the wordline when said third voltage supply circuit supplies said third voltage to the wordline, said first isolating transistor has a substrate coupled to said first node.

2. The circuit of claim 1, in which said first voltage and said second voltage are greater than said third voltage.

3. The circuit of claim 2, in which said first voltage is positive, said second voltage is ground, and said third voltage is negative.

4. The circuit of claim 1, in which said first voltage supply circuit includes a programming voltage source, a sense voltage source, and a switch for selectively coupling one of said programming voltage source and said sense voltage source to said 5. The circuit of claim 1, in which said second voltage supply circuit includes a disturb-protect voltage source, a reference voltage source, and a switch for selectively coupling one of said disturb-protect voltage source and said reference voltage source to said second node.

6. The circuit of claim 1, in which said third voltage supply circuit includes an erase voltage source and a second isolating transistor having a current path coupled between said erase voltage source and the wordline.

7. The circuit of claim 6, in which said erase voltage source supplies negative voltage pulses when active and has a high impedance when not active.

8. The circuit of claim 6, in which said second isolating transistor has a control electrode coupled to said erase voltage source.

9. The circuit of claim 6, in which said second isolating transistor has a substrate coupled to said first node.

10. The circuit of claim 1, in which said first transistor and said first isolating transistor are of a first conductivity type and said second transistor is of a second conductivity type opposite said first conductivity type.

11. The circuit of claim 10, in which said first transistor and said first isolating transistor are n-channel field effect transistors and said second transistor is a p-channel field effect transistor.

12. The circuit of claim 1, in which said first voltage supply circuit includes a programming voltage source, a sense voltage source, and a first switch for selectively coupling one of said programming voltage source and said sense voltage source to said first node;
    said second voltage supply circuit includes a disturb-protect voltage source, a reference voltage source, and a second switch for selectively coupling one of said disturb-protect voltage source and said reference voltage source to said second node; and
    said third voltage supply circuit includes an erase voltage source and a second isolating transistor having a current path coupled between said erase voltage source and the wordline.

13. The circuit of claim 12, further including:
    a supply voltage source;
    a signalling voltage source, said signalling voltage source supplying a voltage less than voltages supplied by supply voltage source, said programming voltage source, said sense voltage source, said disturb-protect voltage source, and said reference voltage source and greater than a voltage supplied by said erasing voltage source; and
    a third switch for selectively coupling one of said supply voltage source, said sense voltage source, and said signalling voltage source to a control electrode of said first isolating transistor.

14. The circuit of claim 13, further including:
    a fourth switch for selectively coupling one of said supply voltage source and said reference voltage source to control electrodes of said first and second transistors.

15. The circuit of claim 14, further including:
    a third isolating transistor having a current path coupled between said third switch and said control electrodes of said first and second transistors.

16. The circuit of claim 14, in which said programming voltage source supplies a voltage in the range of +12 to +16 volts, said sense voltage source supplies a voltage of approximately +3 volts, said disturb-protect voltage source supplies a voltage in the range of +6 to +8 volts, said reference voltage source supplies ground potential, said erase voltage source supplies a voltage in the range −12 to −14 volts, said supply voltage source supplies a voltage in the range of +4 to +6 volts, and said signalling voltage source supplies a voltage in the range of −3 to −5 volts.

17. The circuit of claim 16, in which said first transistor, said first isolating transistor, and said second isolating transistor have substrates coupled to said first node.

18. The circuit of claim 1, further including:
    a feedback transistor having a current path coupled between said first node and control electrodes of said first and second transistors and a control electrode coupled to said output node.

19. The circuit of claim 18, in which said feedback transistor has a substrate coupled to said first node.

* * * * *